United States Patent [19]

Woo et al.

[11] Patent Number: 5,408,130
[45] Date of Patent: Apr. 18, 1995

[54] INTERCONNECTION STRUCTURE FOR CONDUCTIVE LAYERS

[75] Inventors: Michael P. Woo; James D. Hayden; Richard D. Sivan; Howard C. Kirsch; Bich-Yen Nguyen, all of Austin, Tex.

[73] Assignee: Motorola, Inc., Schaumburg, Ill.

[21] Appl. No.: 286,592

[22] Filed: Aug. 5, 1994

Related U.S. Application Data

[60] Continuation of Ser. No. 98,925, Jul. 29, 1993, abandoned, which is a division of Ser. No. 937,025, Aug. 31, 1992, Pat. No. 5,262,532.

[51] Int. Cl.6 .................. H01L 23/48; H01L 29/46; H01L 29/62
[52] U.S. Cl. .................. 257/758; 257/774; 257/769; 257/754; 257/750
[58] Field of Search .............. 257/774, 758, 750, 751, 257/754, 755, 756, 757, 773, 769

[56] References Cited

U.S. PATENT DOCUMENTS

| | | | |
|---|---|---|---|
| 4,656,732 | 4/1987 | Teng et al. | 29/591 |
| 4,700,457 | 1/1986 | Matsukawa | 437/52 |
| 4,872,050 | 10/1989 | Okamoto et al. | 257/758 |
| 4,900,695 | 2/1990 | Takahashi et al. | 257/774 |
| 4,924,295 | 5/1990 | Küecher | 257/758 |
| 4,977,105 | 8/1989 | Okamoto et al. | 437/190 |
| 5,045,501 | 8/1988 | Grinberg | 437/180 |
| 5,051,794 | 9/1991 | Mori | 357/235 |
| 5,091,762 | 2/1992 | Watanabe | 357/23.6 |
| 5,100,838 | 3/1992 | Dennison | 437/195 |
| 5,116,776 | 5/1992 | Chan et al. | 437/52 |
| 5,204,286 | 10/1991 | Doan | 437/195 |

OTHER PUBLICATIONS

"A Split Wordline Cell for 16Mb SRAM Using Polysilicon Sidewall Contacts," by Itabashi et al., published via IEDM 1991, pp. 477-480.

Primary Examiner—Jerome Jackson
Assistant Examiner—John F. Guay
Attorney, Agent, or Firm—Keith E. Witek

[57] ABSTRACT

An interconnect structure is formed having a substrate (10). A conductive layer (14) is formed overlying the substrate (10). A conductive layer (18) is formed overlying the conductive layer (14). An opening (19) is etched through the conductive layer (18), exposing a top portion of conductive layer (14), and forming a sidewall of the conductive layer (18). An selective isotropic etch procedure is used to laterally recess the sidewall of the conductive layer (18). A sidewall spacer (22) is formed adjacent the sidewall of the conductive layer (18). A conductive layer (24) is formed within opening (19) and adjacent the spacer (22) to form an interconnection between conductive layers (24 and 14). The interconnection is self-aligned, and conductive layer (18) is reliably isolated from the interconnect due to the lateral recessed sidewall of the conductive layer (18).

18 Claims, 7 Drawing Sheets

5,408,130

INTERCONNECTION STRUCTURE FOR CONDUCTIVE LAYERS

This application is a continuation of prior application Ser. No. 08/098,925, filed Jul. 29, 1993, now abandoned which is a divisional of U.S. Pat. No. 5,262,532, prior application Ser. No. 07/937,025, filed on Aug. 31, 1992, entitled "AN INTERCONNECTION STRUCTURE FOR CONDUCTIVE LAYERS AND METHOD OF FORMATION" (original title).

FIELD OF THE INVENTION

The present invention relates generally to semiconductor technology, and more particularly, to conductive layer interconnects.

BACKGROUND OF THE INVENTION

In the integrated circuit industry, the formation of contacts and interconnects from one layer of conductive material to another layer of conductive material is required. As integrated circuit surface densities increase, the area in which contacts and interconnections may be made decreases. In addition, yield reduction, increases in capacitive coupling, and electrical short circuit problems tend to occur via contacts in dense integrated circuits.

In many cases, integrated circuits contain four or more conductive layers which overlie the substrate. The conductive layers are used for electrical routing of integrated circuit devices and device formation. In some cases, it is necessary to connect a top conductive layer (i.e. a fourth or a fifth conductive layer) to a lower conductive layer (i.e. a first, a second conductive layer, or a diffusion). These contacts or interconnects are difficult to form if the intermediate layers (i.e. a third conductive layer) are positioned in close proximity to where the contact or interconnect is to be formed.

In one conventional form, if electrical contact is to be made between, for example, the fourth conductive layer and the first conductive layer, the fourth conductive layer is electrically connected to the third conductive layer, the third layer is electrically connected to the second layer, and the second conductive layer is electrically connected to the first conductive layer to complete the electrical contact. This contact methodology requires multiple non-self-aligned alignments, precise alignment tolerances, the use of several conductors in a redundant manner to form a single contact, a larger surface area, and in general this method is not applicable to dense integrated circuit designs.

In order to form a contact, for example, from the conductive layer three to conductive layer one, conductive layer two may be laid out within certain predetermined distances or separations from the contact region. Therefore, conductive layer three connects directly to conductive layer one without the use of conductive layer two. Disadvantages to this approach include the fact that the above-mentioned predetermined distances are lithographic tolerance defined and therefore relatively large, the contact is not self aligned, a total surface area of the integrated circuit is increased, and the layout of conductive layer two is restricted and may be functionally impaired.

Another method is used in order to reduce limitations to the intermediate conductive layers and to improve alignment. For example, a diffusion is formed within the substrate and a first conductive layer is formed over the diffusion. A contact hole is etched through the first conductive layer forming a first conductive layer sidewall and exposes a surface of the diffusion. A sidewall spacer is used to isolate the first conductive layer sidewall within the opening. A second conductive layer is deposited to connect the second conductive layer to the diffusion while the first conductive layer remains isolated by the spacer.

One problem with this approach is in order for spacers to form, a near perfect vertical contact sidewall profile is required. Either very thin spacers (less than a few hundred angstroms thick) or no spacers form adjacent contact sidewalls which have profiles at an angle other than near vertical. For example, if a contact hole is formed wherein the contact hole has a sidewall that is angled at a sixty to eighty degree angle or less, the spacer may not properly form and the first conductive layer may be inadvertently electrically short circuited to the contact. Therefore, the above mentioned spacer method results in a reduced process window, reduced yield, increased capacitive coupling (due to the thin dielectric spacer between the contact and the first conductive layer), and reduced lifetime reliability.

SUMMARY OF THE INVENTION

The previously mentioned disadvantages are overcome and other advantages achieved with the present invention. In one form, the present invention comprises an interconnection structure and method of formation. A first conductive layer is formed. A first dielectric layer is formed overlying the first conductive layer, and a second conductive layer is formed overlying the first dielectric layer. A second dielectric layer is formed overlying the second conductive layer An opening is formed through the second dielectric layer, the second conductive layer, and the first dielectric layer. The opening exposes a portion of the first conductive layer, and forms a sidewall of the second conductive layer. The sidewall of the second conductive layer is laterally recessed to form a recessed sidewall of the second conductive layer. A sidewall dielectric is formed adjacent the recessed sidewall of the second conductive layer. A third conductive layer is formed within the opening. The third conductive layer forms electric contact to the first conductive layer.

The present invention will be more clearly understood from the detailed description below in conjunction with the accompanying drawings.

DESCRIPTION OF A PREFERRED EMBODIMENT

Described herein is a contact and/or interconnection strategy which allows for the formation of a fully self-aligned contact and/or interconnect. In addition, the contact and/or interconnect, hereafter referred to primarily as one of either a contact or an interconnect, allows for increased yield, increased process windows, reduced capacitive coupling between conductive layers, improved lifetime reliability, decreased integrated circuit surface area (i.e. more dense circuits), improved flexibility and improved functionality of conductive layers when compared to conventional methods of contacting. Furthermore, selective contacts between multiple layers may be formed. For example, three conductive layers such as a diffusion, a second conductive layer, and a fourth conductive layer may be connected in a single self-aligned contact hole, fully self-aligned, with minimal surface area, and will have all of the advantages and flexibility discussed above and herein.

Figure 1:
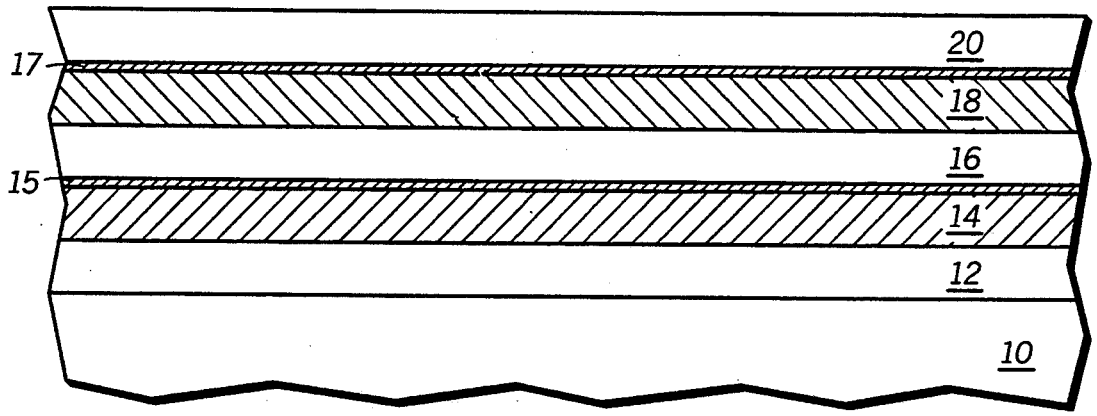
FIGS. 1–3 illustrate, in cross-sectional form, a method for forming an interconnection structure in accordance with the present invention.

Illustrated in FIG. 1 is structure suitable for formation of an interconnection structure. A substrate 10 is provided. Substrate 10 preferably has a top planar surface prior to semiconductor processing. The substrate 10 is formed having a conductivity type which is one of either a P type conductivity or an N type conductivity if the substrate 10 is silicon-based. Substrate 10 may be made of silicon, gallium arsenide, silicon on insulator (SOI) structures, epitaxial formations, germanium, germanium silicon, polysilicon, amorphous silicon, and/or like substrate, semiconductive, or conductive materials. Preferably, the substrate 10 is made of single-crystalline silicon, and is usually doped with boron, phosphorus, or arsenic atoms.

A layer 12 is illustrated in FIG. 1. Layer 12 may be a dielectric layer or layer 12 may be a plurality of device layers. Device layers are defined as being any conductive, semiconductive, dielectric layer, or similar layer which may be formed on or within the integrated circuit substrate 10. Device layers may be used to form devices such as transistors, diodes, capacitors, and the like. Layer 12 is used to illustrate that the interconnection structures presented herein may be positioned directly over the substrate 10, may be positioned overlying several layers of material, or may be positioned over one or more active devices.

A conductive layer 14 is formed overlying the layer 12. Conductive layer 14 may be any known conductive layer, such as metal, metal alloys, epitaxial formations, and the like, but is preferably either N-doped or P-doped polysilicon. If conductive layer 14 is a polysilicon layer, a salicided or silicided layer 15 is optionally formed over a top portion of the conductive layer 14 to improve polysilicon conductivity. The silicided layer 15 and other silicided layers discussed herein may be formed via tungsten, platinum, titanium, cobalt, or like metallic elements.

A dielectric layer 16 is formed overlying the silicided layer 15. Dielectric layer 16 is formed overlying the conductive layer 14 if the silicided layer 15 is not formed. The dielectric layers which are discussed herein may be wet or dry silicon dioxide ($SiO_2$), silicon nitride, tetraethylorthosilicate (TEOS) based oxides, borophospho-silicate-glass (BPSG), phospho-silicate-glass (PSG), boro-silicate-glass (BSG), oxide-nitride-oxide (ONO), oxynitride materials, plasma enhanced silicon nitride (P—$SiN_x$), a spin on glass (SOG), and/or like dielectric materials or composite dielectric films. Dielectric layer 16 is preferably a TEOS-based oxide layer.

A conductive layer 18 is formed overlying the dielectric layer 16. The conductive layer 18 is similar to conductive layer 14 and is preferably a polysilicon layer. Other known conductive or semiconductive layers may be used for conductive layer 18. A salicided or silicided layer 17 is formed overlying the conductive layer 18. Silicided layer 17 is optional and is similar to silicided layer 15. A dielectric layer 20 is formed overlying the silicided layer 17. If the silicided layer 17 is not formed, the dielectric layer 20 is formed overlying the conductive layer 18. Dielectric layer 20 is preferably a TEOS based oxide.

Figure 2:
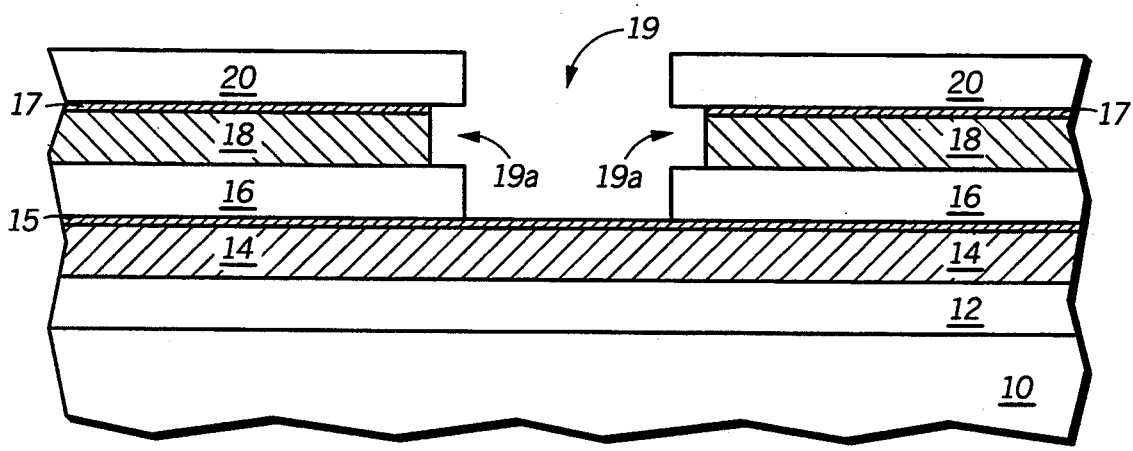

In FIG. 2, an opening 19 is formed sequentially through the layers 20, 17, 18, and 16. In order to form the opening 19, a masking layer (not illustrated), such as photoresist, is formed overlying the dielectric layer 20. The masking layer (not illustrated) is exposed to light or like radiation and developed to form an opening (not illustrated) in the masking layer. This opening in the masking layer is used to define the geometry of the opening 19. In most cases, the opening 19 will be less than one micron in diameter. In general, oxides may be etched using, for example, a $CHF_3$ and $O_2$ plasma or a $C_2F_6$ plasma. Polysilicon may be etched using an HBr and $Cl_2$ plasma or a $CF_4$/oxygen environment. Silicided layers may be etched via a chlorine HBr ambient. Any of the above stated plasma environments may contain one or more inert carrier gases such as Ar, $H_2$, He, $N_2$, or a like inert carrier gas.

To form opening 19, dielectric layer 20 is reactive ion etched (RIE) or etched in a like manner. Both the silicided layer 17 and the conductive layer 18 are preferably etched in an isotropic manner or in a two step RIE/isotropic manner to form a recessed sidewall portion 19a of the opening 19. An etch process using an $SF_6$/oxygen plasma may be used to simultaneously etch both a silicide layer and a polysilicon layer although a two step process results in a more reliable recessed sidewall profile. To form the recessed sidewall portion 19a, the silicided layer 17 is etched in a first chemistry and the conductive layer 18 is etched in a second chemistry in a preferred form. Dielectric layer 16 is RIE etched wherein the dielectric layer 20 and the overlying masking layer (not illustrated) are used to ensure that the etching of dielectric layer 16 does not form a recessed sidewall as illustrated. The opening 19 is etched in a selective manner so that the opening 19 exposes but does not completely remove silicided layer 15 and conductive layer 14.

In some cases, etch processes involving several etch chemistries and involving the etching of several different material may be "clustered" in a single etch system under one vacuum ambient environment. Many different types of etches may be performed in this manner. For example, a single etch system may have two equipment chambers which are each equipped for isotropic etching and two other chambers which are equipped for anisotropic etching. This system may be used to perform "cluster" etching with improved throughput and improved device quality. Less processing time and fewer exposures to different etch equipment systems usually results in less wafer contamination.

Figure 3:
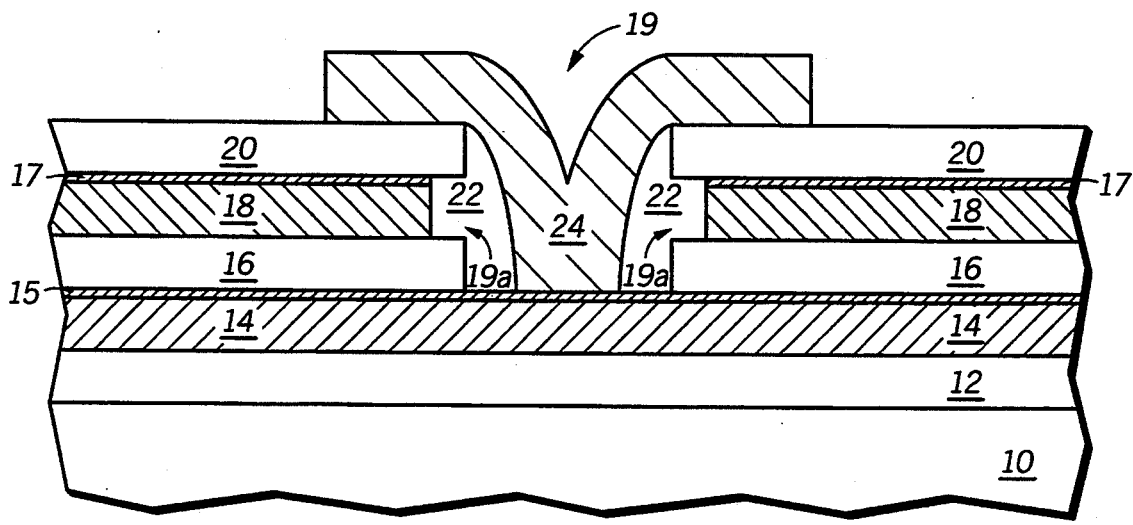

In FIG. 3, a sidewall dielectric, referred to as sidewall spacer 22, is formed adjacent the recessed sidewall portion 19a. Sidewall spacer 22 is formed as an oxide material, a nitride material, or a like insulator. Preferably, sidewall spacer 22 is a furnace TEOS or a low pressure chemical vapor deposition (LPCVD) silicon nitride layer. Various known etch selectivity values between integrated circuit device layers, and material properties will determine the optimal type of material used for spacer 22.

In some rare cases, the spacer 22 may not entirely form in the recessed sidewall portion 19a. If this phenomenon is a problem, a brief sidewall oxidation of the sidewall of the conductive layer 18 may be performed to form a sidewall oxidation layer (not illustrated). Once this sidewall oxidation step has partially or totally filled the recessed sidewall portion 19a, the spacer may be formed adjacent the sidewall oxidation layer (not illustrated). It is important to note that the phenomenon of not entirely filling the recessed sidewall portion 19a has not been observed experimentally when using furnace TEOS or LPCVD silicon nitride.

A conductive layer 24 is formed within the opening 19, adjacent the spacer 22, and electrically contacting one or both of the silicided layer 15 and the conductive layer 14. An interconnection between the conductive layer 24 and the conductive layer 14 has been formed wherein conductive layer 18 is isolated via the spacer 22. Preferably, the conductive layer 24 is a polysilicon layer which is optionally silicided. It is important to note that the conductive layer 24, as well as other conductive layers presented herein are not limited to polysilicon but may be made of metal, metal alloys, silicides, salicides, semiconductive material, and other like conductive and/or semiconductive formations.

The interconnect structure illustrated in FIG. 3 has several advantages over the prior art. The contact opening 19 illustrated in FIG. 3 is illustrated as having an ideal vertical sidewall (i.e. 90°). This vertical sidewall is said to have a 90° contact profile. In reality, contact profiles may vary from retrograded (i.e. greater than 90°) to roughly 60° in profile from contact to contact, die to die, and wafer to wafer within a semiconductor wafer lot. Sidewall spacers formed adjacent contact sidewalls which have profiles less than 85° were experimentally found to be thin and unreliable. These thin spacers increase capacitive coupling between conductive layers, increase the tendency for electrical short circuits, reduce wafer lot yield, and reduce integrated circuit lifetime reliability.

By forming recessed sidewall portion 19a, the unwanted effects of a thin spacer 22 are reduced or eliminated for all contact profiles. Therefore, the contact of FIG. 3 has reduced capacitive coupling between conductive layer 18 and conductive layer 24, improved yield, improved integrated circuit lifetime, and reduced tendency towards electrical short circuiting. Furthermore, the contact of FIG. 3 is fully self-aligned and therefore has a small surface area, reduced tolerance limitations, and reduced reliance on lithographic alignment.

In addition, sidewall isolation has been formed in the prior art by using sidewall oxidation techniques. Sidewall oxidation techniques or thermal oxidation of sidewalls alone may be feasible for some applications but not all. Firstly, sidewall oxides will either not form or will not be of a good quality when formed from a silicided layer, a polysilicon layer, or a metal layer. Therefore, if a sidewall oxide is formed adjacent silicided layer 17, or if a metallic material is used for conductive layer 18, the sidewall oxidation is either impossible to perform or not reliable due to the fact that oxide growth adjacent these materials are of a poor quality. In addition, thermal oxide growth on a polysilicon layer is possible but this oxide is inferior in isolation capability and leakage current when compared to an LPCVD nitride spacer or a furnace TEOS spacer. Therefore, the structure illustrated in FIG. 3 is superior to the prior art interconnection structures in many ways.

Furthermore, the conductive layers which are isolated from the contact, for example conductive layer 18, are not limited in functionality or position in FIG. 3. In the prior art, the conductive layer 18 is in some cases required to be positioned away from the contact opening 19 to avoid electrical short circuiting to conductive layer 24. This positioning is determined by lithographic alignment tolerances and may limit conductive layer 18 by separations/distances which measure on the order of a micron to one tenth of a micron. The known tolerance-determined positioning limitation of the prior art interconnection conductive layers may limit the functionality, complexity, performance, surface area, and/or layout freedom associated with a conductive layer. For example, if the conductive layer 18 is a ground voltage plane, the reduction in surface area which results from the noted tolerance positioning limitations will increase the resistance of the ground voltage plane or increase ground interconnect wiring. Increased ground resistance and increased ground routing is not desirable. Also conductive layer 18 may not be capable of being easily routed to another integrated circuit location due to an intervening contact hole. These problems are avoided or overcome by using the methods taught herein.

It is important to note that numerous conductive plug and conductive planarized interconnect technologies exist. For example, several structures are taught in the prior art wherein one or more barrier regions or peripheral regions (i.e. titanium nitride, silicides, titanium/tungsten, or the like) and one or more conductive plug materials (i.e. tungsten, other refractory metals, metal composites, metals, silicides or salicides, or the like) are used. Any one of these known plugs may be used as conductive layer 24 to improve interconnection performance.

Figure 4:
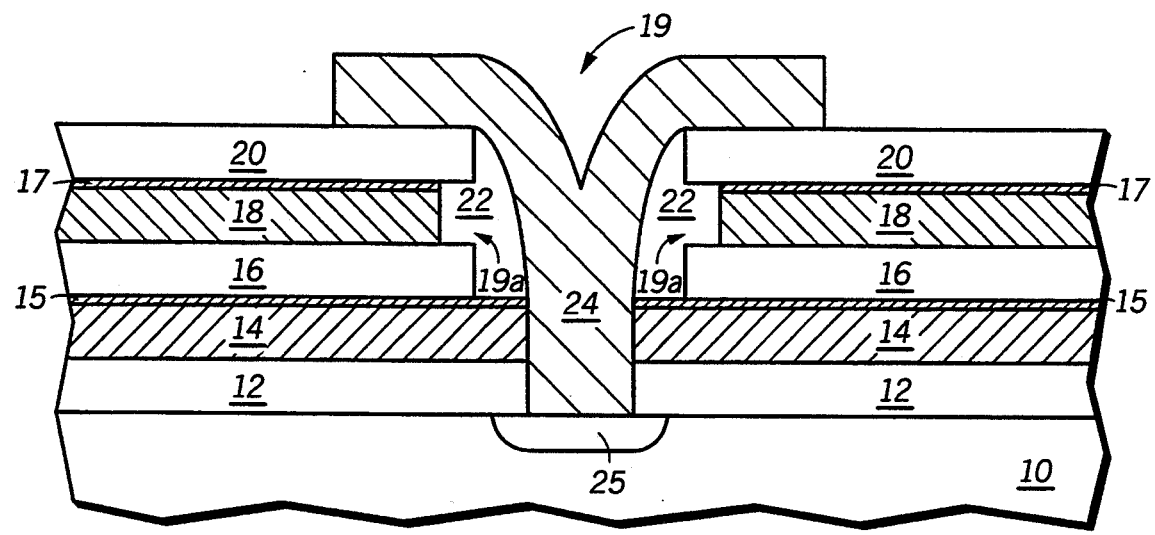
FIG. 4 illustrates, in cross-sectional form, an alternative interconnection structure.

FIG. 4 illustrates another interconnection structure. The structure of FIG. 4 may be manufactured by first performing the steps illustrated and discussed in reference to FIGS. 1-2. After the structure of FIG. 2 is achieved, the spacer 22 is formed in a manner similar to FIG. 3. After the spacer 22 is formed, an etch process is used to etch through the layers 15, 14, and 12 to expose a portion of the surface of the substrate 10. The etch is self-aligned to opening 19 via the spacer 22. An optional diffusion 25 is either previously formed in a non-self-aligned conventional manner prior to formation of the opening 19, or is formed self-aligned to contact opening 19 after the substrate 10 is exposed. The diffusion 25 is a phosphorus, arsenic, and/or boron doped portion of the substrate 10. The opening in conductive layer 14 forms a sidewall of conductive layer 14.

The conductive layer 24 is formed within the opening 19 and electrically connects conductive layer 24 to conductive layer 14. One of either the diffusion 25 or the substrate 10 is electrically contacted via the conductive layer 24. A substrate contact or a contact to an electrode of a transistor may be formed in this manner.

Figure 5:
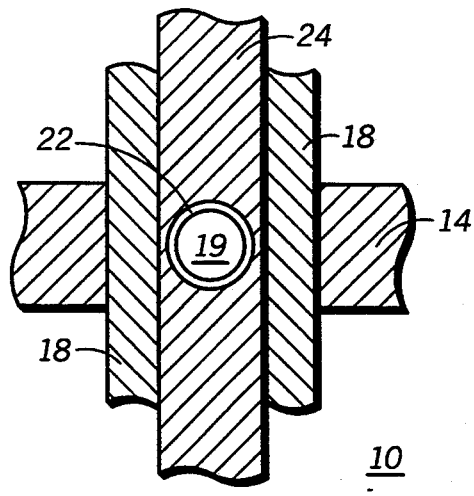
FIG. 5 illustrates in a top perspective view a structure which is analogous to the cross-section of FIG. 3.
Figure 6:
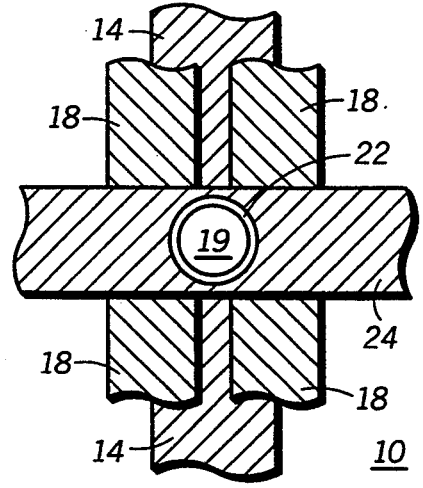
FIG. 6 illustrates in a top perspective view another structure which is analogous to the cross-section of FIG. 3.
Figure 7:
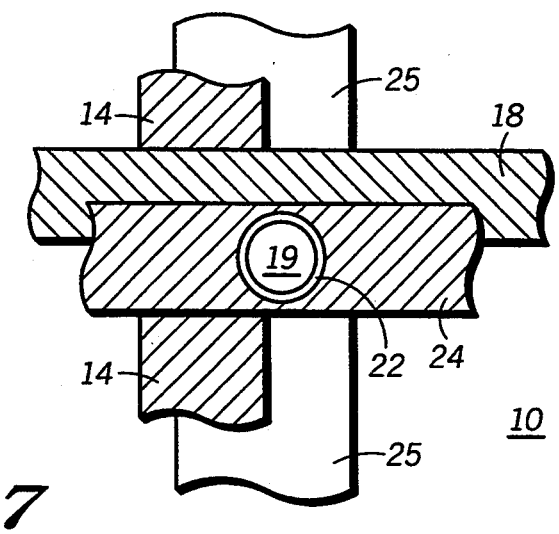
FIG. 7 illustrates in a top perspective view a structure which is analogous to the cross-section of FIG. 4.

FIGS. 5–7 illustrate several top perspective views of structures which are analogous to one of either FIG. 3 or FIG. 4. Elements in FIGS. 5–7 which are analogous to elements in FIGS. 1–4 are identically labeled. In FIG. 5, the contact opening 19 forms a hole through a central portion of conductive layer 18, and exposes a central portion of conducive layer 14. The spacer 22 is formed around a peripheral sidewall of the opening 19. Conductive layer 24 is formed within the contact opening 19 to electrically connect conductive layer 24 to conductive layer 14.

FIG. 6 illustrates the contact opening 19. The contact opening 19 intersects a peripheral portion of a first portion of conductive layer 18 and intersects a peripheral portion of a second portion of conductive layer 18. Contact opening 19 exposes a central portion of conductive layer 14. Spacer 22 is formed and conductive layer 24 is formed to complete the electrical contact. Conductive layer 18 is isolated from the connection via the spacer 22.

FIG. 7 also illustrates the contact opening 19. Contact opening 19 intersects a peripheral portion of conductive layer 18, intersects a peripheral portion of conductive layer 14, and exposes a portion of diffusion 25. The spacer 22 is formed to isolate selective conductive layers exposed on a sidewall via the opening 19. The conductive layer 24 is formed to complete the contact.

FIGS. 5–7 illustrate only three of several top perspective design possibilities. Other permutations of top down contact configurations exist using intersected lines, spacer isolated lines, and exposed portions of conductive layers. By using the teachings of FIG. 1–7, other interconnection structures may be readily derived.

Figure 8:
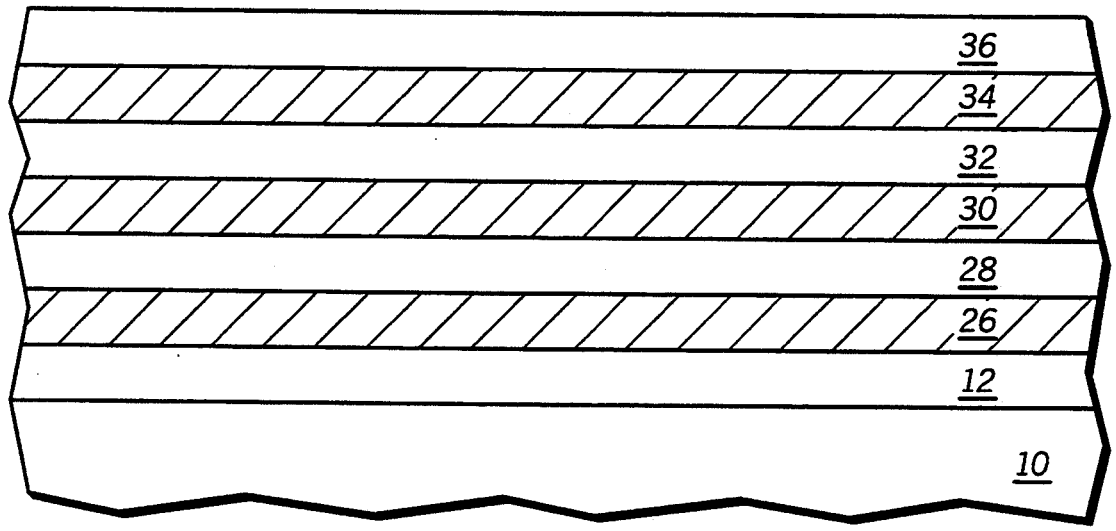
FIGS. 8–9 illustrate, in cross-sectional form, another method for forming an interconnection structure in accordance with the present invention.

FIG. 8 illustrates a structure suitable for formation of an interconnection structure. The substrate 10 is illustrated along with the layer 12. Substrate 10 and layer 12 are analogous to the substrate 10 and layer 12 of FIG. 1. A conductive layer 26 is formed overlying the layer 12. A dielectric layer 28 is formed overlying the conductive layer 26. A conductive layer 30 is formed overlying dielectric layer 28. A dielectric layer 32 is formed overlying conductive layer 30. A conductive layer 34 is formed overlying dielectric layer 32. A dielectric layer 36 is formed overlying the conductive layer 34.

The dielectric layers 28, 32, and 36 may be any known insulator or any dielectric material discussed herein. Each of the conductive layers 26, 30, and 34 is either a metal, a silicon-based material, or any known conductive or semiconductive material. If a silicon-based conductive material is used to form one or more of the conductive layers 26, 30, and 34, the silicon-based conductive material (e.g. polysilicon, epitaxial silicon, etc.) is optionally silicided or salicided.

Figure 9:
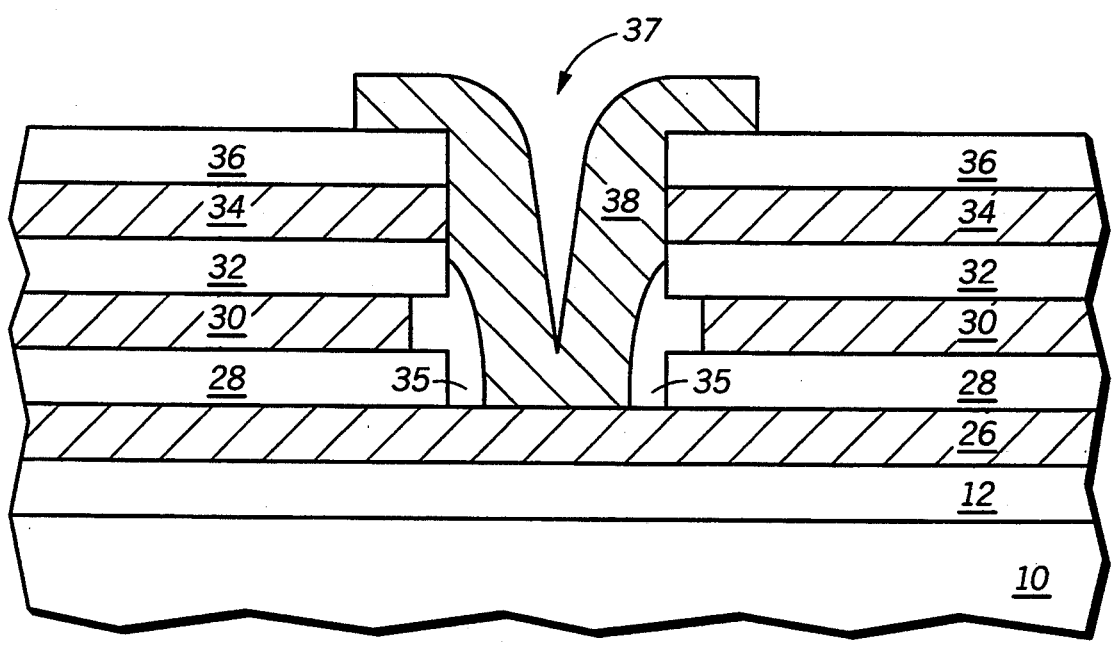

In FIG. 9, layers 28, 30, 32, 34, and 36 are etched as described herein to form an opening 37. Furnace TEOS, LPCVD nitride, or a like conformal dielectric is deposited and RIE etched to form a spacer 35. The spacer 35 is vertically recessed downward from a sidewall of conductive layer 34 via an RIE over-etch step. The RIE over-etch step exposes the sidewall of conductive layer 34 while isolating conductive layer 30 via spacer 35. A conductive layer 38 is formed within opening 37 and electrically connects conductive layer 38, conductive layer 34, and conductive layer 26.

In FIG. 9, the isotropic recessed etch process discussed herein is used to laterally recess the sidewalls of conductive layer 30 prior to the formation of spacer 35. This lateral recessing is selective to the adjacent dielectric layers 28, 32, and 36. Methods of making sidewall masks are known. These sidewall masks may be used to protect sidewall regions from isotropic etch steps.

Figure 10:
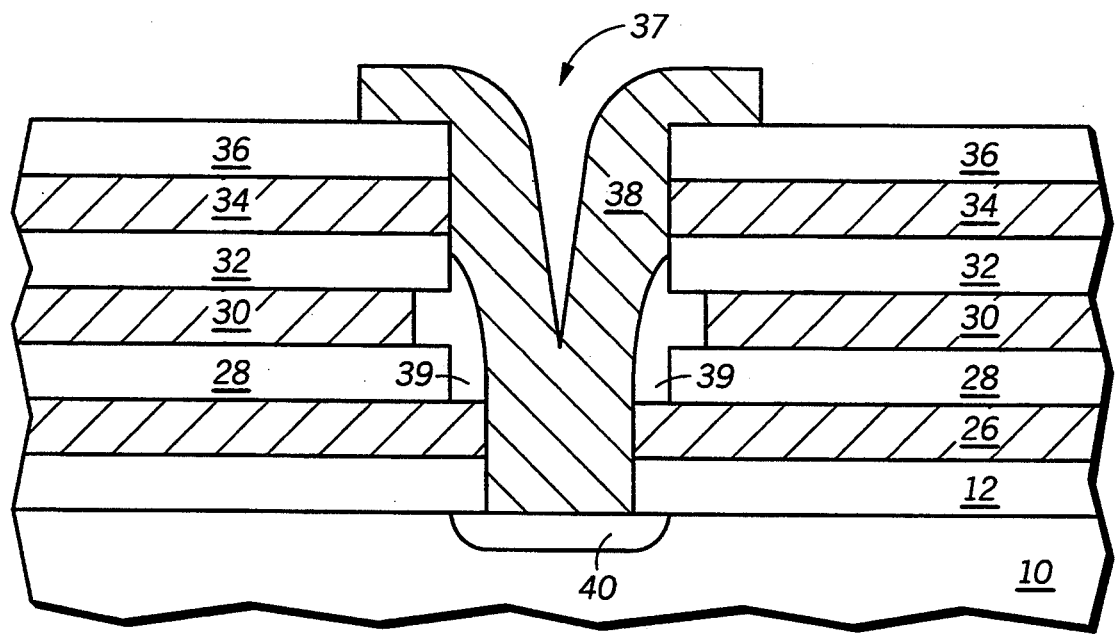
FIGS. 10–14 each illustrate, in cross-sectional form, alternative interconnection structures which are formed via the structure illustrated in FIG. 8.

FIG. 10 illustrates another structure which may be formed via the structure of FIG. 8. In FIG. 10, layers 28, 30, 32, 34, and 36 are etched as in FIG. 9 to form the opening 37. A spacer 39, which is similar to spacer 25 of FIG. 9 is formed. The spacer 39 is used to etch a self-aligned hole through layers 26 and 12 to expose the substrate 10. A diffusion 40 is optionally formed within the substrate as taught herein. The conductive layer 38 is formed to contact conductive layers 38, 34, and 26 to the diffusion 40 or the substrate 10. Conductive layer 30 is isolated from the contact via spacer 39 and a lateral recessing step.

Figure 11:
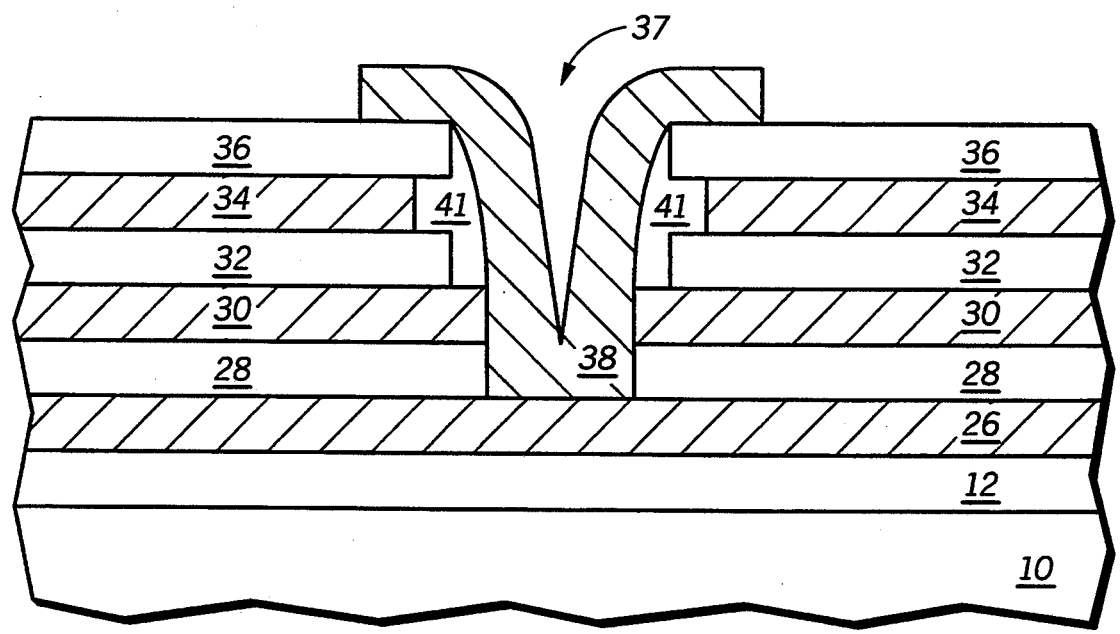

FIG. 11 illustrates another interconnection structure. The structure of FIG. 8 is etched to form the opening 37 through layers 32, 34, and 36. A spacer 41 is formed to isolate the conductive layer 34. The layers 28 and 30 are etched self-aligned to the spacer 41. The layer 34 is isotropically recessed as discussed herein for improved isolation and reliability. The conductive layer 38 electrically connects together conductive layers 38, 30, and 26. It should be noted that a contact to the substrate 10 or diffusion contact (not illustrated) may be made via the structure of FIG. 11 by etching through layers 26 and 12 as taught herein.

Figure 12:
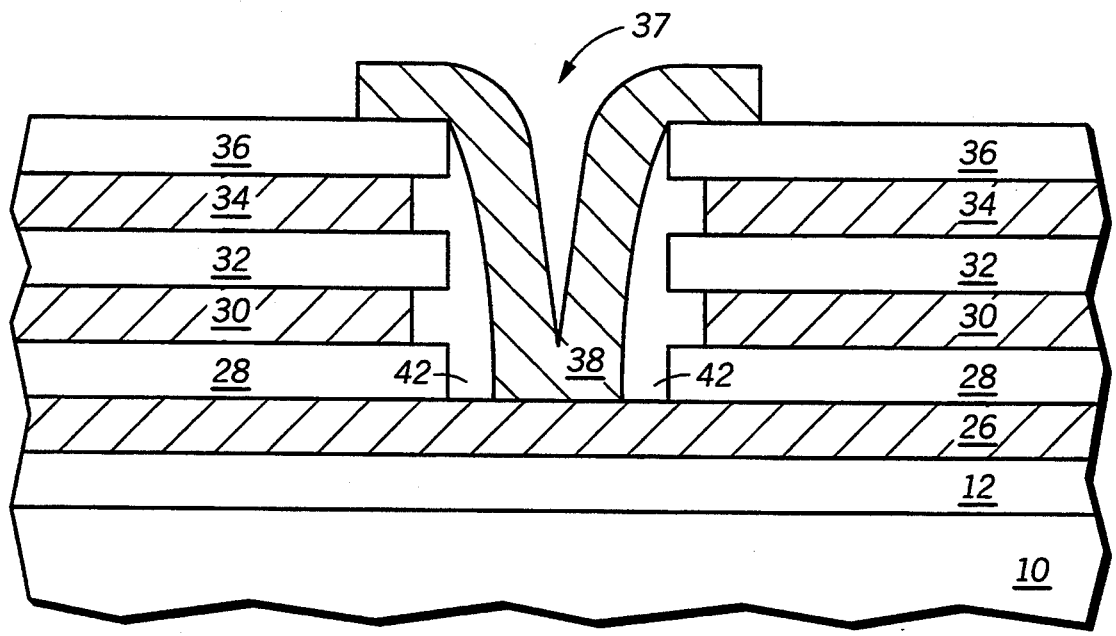

FIG. 12 illustrates yet another interconnection structure. The structure of FIG. 8 is etched to form the opening 37 through layers 28, 30, 32, 34, and 36. The conductive layers 30 and 34 may both be isotropically recessed or be individually isotropically etched as taught herein to improve isolation and reliability. A spacer 42 is formed to isolate the conductive layer 34. The conductive layer 38 electrically connects together conductive layers 38 and 26 while isolating, in a self-aligned manner and in a small surface area, conductive layers 30 and 34 from the interconnection.

Figure 13:
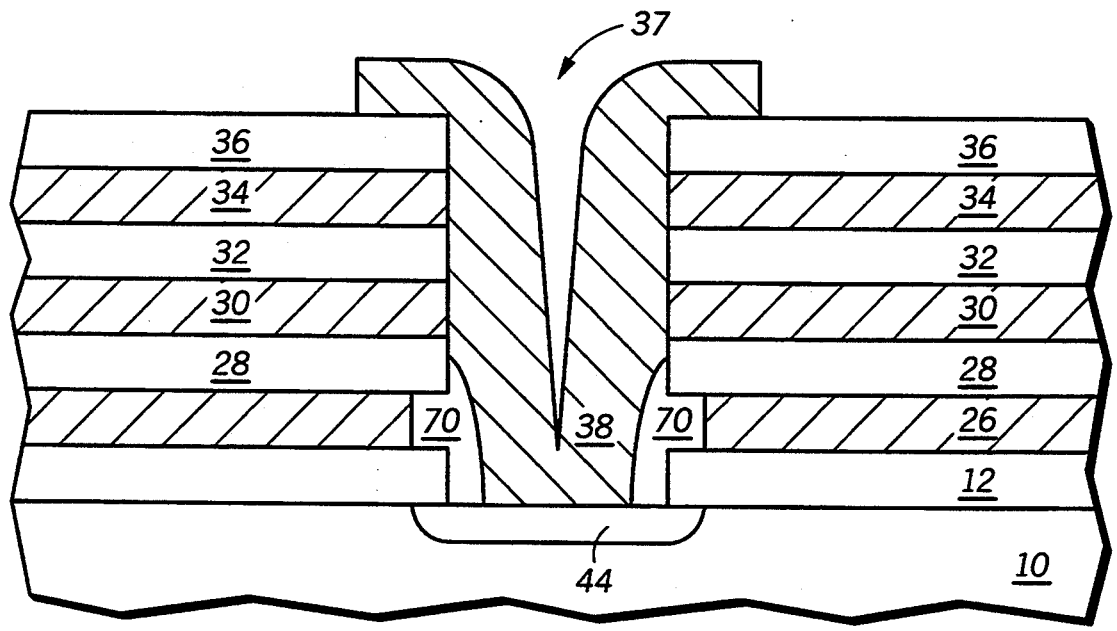

FIG. 13 illustrates yet another interconnection structure. The structure of FIG. 8 is etched to form the opening 37 through layers 12, 26, 28, 30, 32, 34, and 36. The conductive layer 26 may be isotropically recessed as taught herein to improve isolation and reliability. The conductive layer 38 electrically connects together conductive layers 30, 34, and 38. The interconnect contacts to an optional diffusion 44. The interconnect connects to the substrate 10 if the diffusion 44 is not formed.

Figure 14:
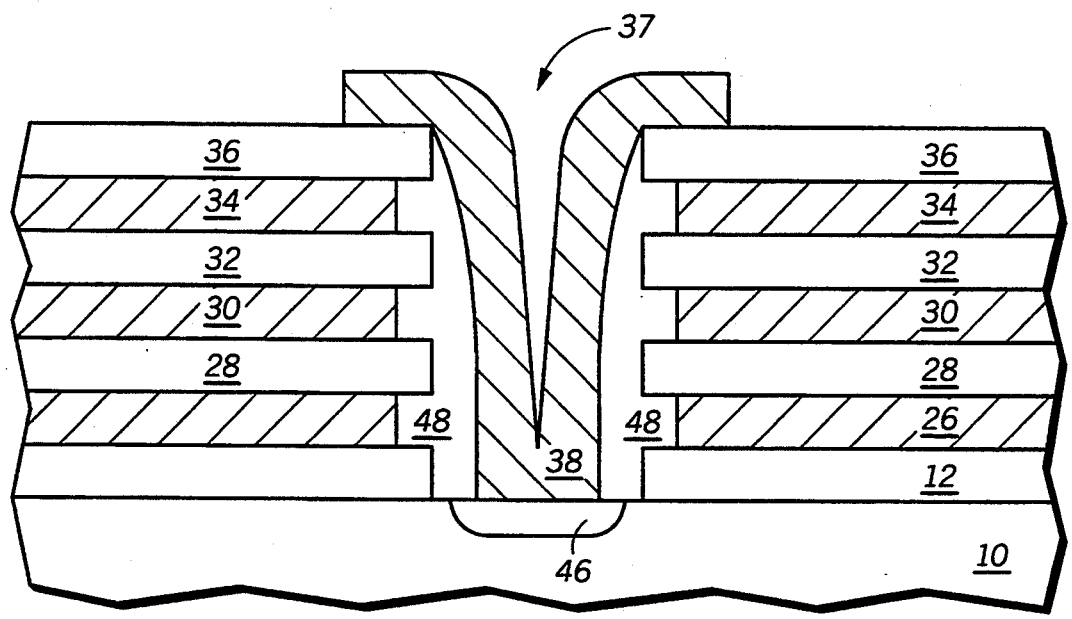

FIG. 14 illustrates yet another interconnection structure. The structure of FIG. 8 is etched to form the opening 37 through layers 12, 26, 28, 30, 32, 34, and 36. The conductive layers 26, 30, and/or 34 may be isotropically recessed via one or more selective isotropic etch steps as taught herein to improved isolation and reliability. A spacer 48 is formed to isolate conductive layers 26, 30, and 34 from the interconnection. The conductive layer 38 electrically contacts to a diffusion 46 or the substrate 10 to form an interconnect.

FIGS. 1–14 do not exhaustively illustrate all combinations of interconnect structures which may result using the techniques taught herein. It should be understood from FIGS. 1–14 that other interconnect structures having N conductive layers, wherein N is a positive integer, may be formed. The N conductive layers may be isolated by dielectric layers as illustrated herein.

The N conductive layers may be selectively connected as taught herein via sidewall recess processing, etch processing which is used to form openings, deposition techniques, and spacer formation. A typical number for N may be any value ranging from two through eight.

For example, six conductive layers may be formed wherein the six conductive layers are rank-ordered with layer one being a bottom layer and layer six being a top layer. Layer six may be connected to layer two, connected to layer one, and optionally connected to a diffusion by forming an opening as taught herein, defining a spacer as taught herein, and depositing a seventh conductive layer to form the interconnection. The layers three through five are isolated from the contact via the spacer.

As contacts and interconnects approach dimensions of 0.35 micron or less, a spacer formed within the contact or interconnect may not be desirable. The spacer reduces a radius of the contact or interconnect thereby increasing contact resistance and adversely affecting contact reliability (i.e. small features may not be completely filled by some conductive materials). Therefore, it is desirable to have a contact having all of the advantages described herein wherein a sidewall spacer is not formed.

Figure 15:
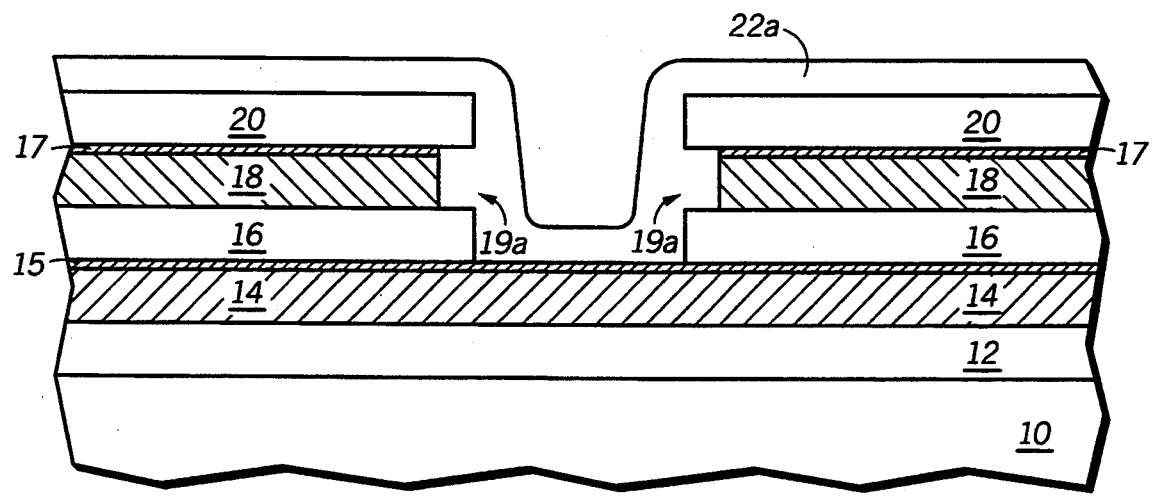
FIGS. 15-17 illustrate, in cross-sectional form, yet another interconnection method which is in accordance with the present invention.
Figure 16:
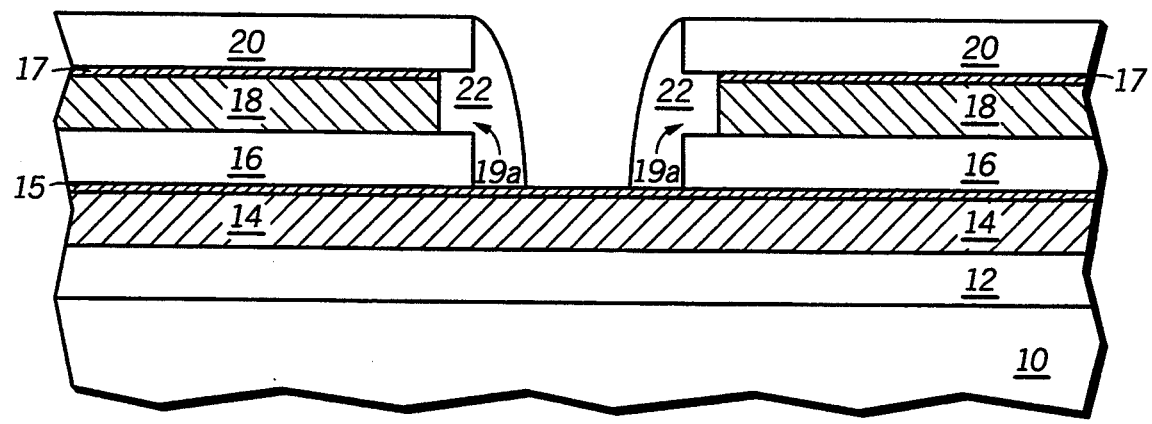
Figure 17:
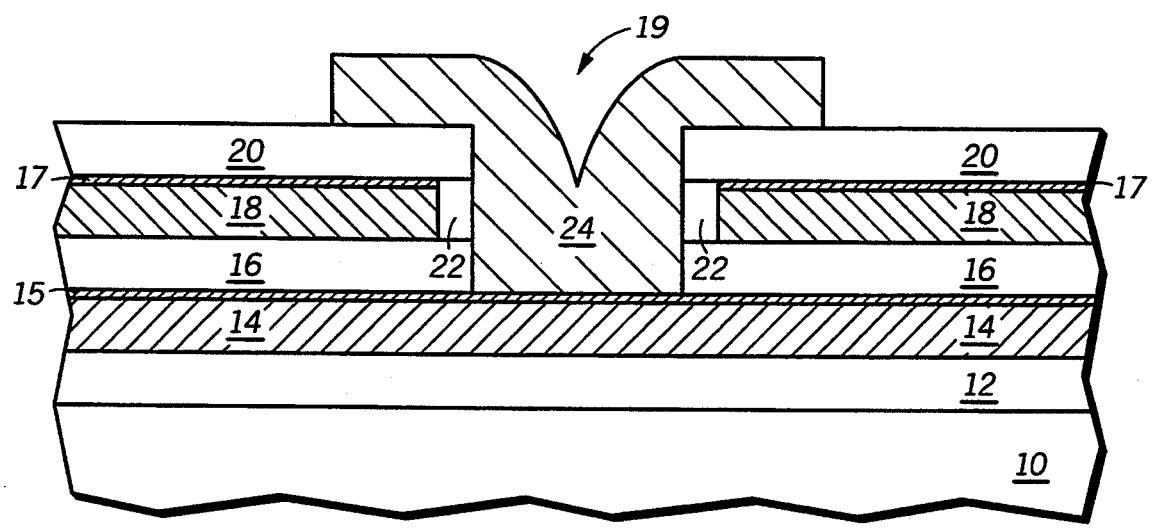

FIGS. 15–17 illustrate a method for forming an interconnection structure wherein isolation is achieved selectively between conductive layers and no spacer is utilized. In FIG. 15, the structure of FIG. 2 is illustrated having a dielectric layer 22a, which is formed by LPCVD nitride, furnace TEOS, or a like dielectric material. All elements in FIG. 15 which are analogous to elements in FIG. 2 are identically labeled.

In FIG. 16, the dielectric layer 22a of FIG. 15 is RIE etched to form the spacer 22. In FIG. 17, the spacer 22 is RIE over-etched to form a region which is now referred to as sidewall oxide region 22. Sidewall oxide region 22 has less defects and has a leakage current which is less than a thermally grown sidewall oxide. In addition, a quality sidewall oxide cannot be grown on a sidewall of a silicide layer whereas sidewall oxide region 22 may be formed adjacent silicided layers. If the contact profile of opening 19 is less than 85°, a spacer may not form on the sidewall and a spacer RIE over-etch step, as illustrated in FIGS. 16–17, may not be required to form sidewall oxide region 22.

It should be apparent that the sidewall oxide region 22 formation method, as illustrated in FIGS. 15–17, may be applied to any embodiment illustrated herein or any inventive method or structure taught herein. The structure illustrated in FIG. 17 has an improved contact resistance, improved isolation due to a higher-quality sidewall dielectric material, and improved contact reliability over the prior art.

While the present invention has been illustrated and described with reference to specific embodiments, further modifications and improvements will occur to those skilled in the art. For example, the polysilicon processes discussed herein were referred to as being a single deposition. Multi-deposition polysilicon processes exist and may be used in accordance with the present invention. N conductive layers, N being any positive integer, may be used to form self-aligned interconnects via the methods taught herein. The contacts discussed herein are useful for memory applications, such as static random access memories (SRAMs) and may be used for vertical integration or vertical logic. Spacers and grown sidewall oxides may be combined to improve isolation between conductive layers (i.e. two different oxide materials may be used, one grown and one deposited). Many conductive materials, plug technology, and dielectric films may be used with the methods and interconnect structures taught herein. Many etch chemistries and etch processes exist for forming contact openings. It is to be understood, therefore, that this invention is not limited to the particular forms illustrated and that it is intended in the appended claims to cover all modifications that do not depart from the spirit and scope of this invention.

We claim:

1. An interconnect structure comprising:
    a first conductive layer;
    a first dielectric layer overlying the first conductive layer, the first dielectric layer having an opening where the opening exposes a portion of the first conductive layer and has a first radius, the opening forming a sidewall of the first dielectric layer;
    a second conductive layer formed overlying the first dielectric layer, the second conductive layer having an opening which is overlies the opening in the first dielectric layer and has an opening center, the second conductive layer having a sidewall which is laterally recessed away from the opening center so that the opening in the second conductive layer has a second radius wherein the second radius is greater than the first radius, the second radius forming a cavity region;
    a second dielectric layer overlying the second conductive layer, the second dielectric layer having an opening which is self-aligned to the opening in the first dielectric layer and having a third radius which is less than the second radius, the opening forming a sidewall of the second dielectric layer;
    a sidewall dielectric layer formed adjacent the sidewall of the second conductive layer to fill the cavity and being formed laterally adjacent both the sidewall of the first dielectric layer and the sidewall of the second dielectric layer; and
    a third conductive layer formed within the opening in the second conductive layer, the third conductive layer making electrical contact to the first conductive layer wherein the third conductive layer is isolated from the second conductive layer by the sidewall dielectric layer.

2. The interconnect structure of claim 1 wherein the opening of the first dielectric layer is extended through the first conductive layer to expose an underlying substrate material wherein the third conductive layer is formed in electrical contact with the substrate material.

3. The interconnect structure of claim 2 further comprising:
    a doped diffusion region formed within the substrate material, the doped diffusion region being in electrical contact with the third conductive layer.

4. The interconnect structure of claim 1 further comprising:
    a silicided layer formed overlying one of: the first conductive layer, the second conductive layer, and the third conductive layer.

5. The interconnect structure of claim 1 further comprising:
    a silicided layer formed overlying each of: the first conductive layer, the second conductive layer, and the third conductive layer.

6. The interconnect structure comprising:
    a substrate having a surface;

N conductive layers formed overlying the substrate wherein N is a positive finite integer greater than one;

the N conductive layers being at least partially electrically isolated by dielectric regions;

an opening formed through at least one of the N conductive layers to form a sidewall of the at least one of the N conductive layers, a sidewall of a first dielectric region overlying the at least one of the N conductive layers, and a sidewall of a second dielectric region underlying the at least one of the N conductive layers, the opening forming a recessed sidewall of the at least one of the N conductive layers wherein a width of the opening through the at least one of the N conductive layers is greater than a width of the opening through both the first dielectric region and the second dielectric region, the opening exposing at least two of the N conductive layers;

a silicided layer overlying each of the N conductive layers; and a connecting conductive layer formed within the opening, the connecting conductive layer being electrically coupled to at least one of the N conductive layers to form said interconnect structure wherein the connecting conductive layer is isolated from the at least one of the N conductive layers by a sidewall dielectric formed laterally adjacent each of the opening through the at least one of the N conductive layers, the sidewall of the first dielectric layer, and the sidewall of the second dielectric layer.

7. The interconnect structure of claim 6 wherein the opening formed through at least one of the N conductive layers is also formed through each of the N conductive layers to expose the underlying substrate wherein the connecting conductive layer is formed within the opening and is electrically contacted to the substrate.

8. The interconnect structure of claim 7 further comprising:

a doped diffusion region formed within the substrate, the doped diffusion region being in electrical contact with the connecting conductive layer.

9. The interconnect structure of claim 6 further comprising:

a silicided layer formed overlying one of the N conductive layers.

10. The interconnect structure of claim 6 wherein the silicided layers overlying the N conductive layers are formed containing a material selected from a group consisting of: tungsten, platinum, titanium, and cobalt.

11. The interconnect structure of claim 6 wherein at least one of the N conductive layers has a laterally recessed sidewall.

12. An interconnection structure comprising:

a substrate having a surface;

a first conductive layer overlying the substrate;

a second dielectric layer overlying the first conductive layer;

a second conductive layer overlying the second dielectric layer, the second conductive layer having a silicided region in direct contact with the second conductive layer;

a third conductive layer overlying the second conductive layer;

an opening through the third dielectric layer, the opening having a diameter which is less than one micron, the opening also being through the second conductive layer, the portion of the opening which is through the second conductive layer having a diameter which is greater than the portion of the opening formed through the third dielectric layer, the opening also being through the second dielectric layer, the portion of the opening which is through the second dielectric layer having a diameter which substantially equal to the diameter of the portion of the opening formed through the third dielectric layer;

a dielectric sidewall region laterally adjacent the second conductive layer and the second dielectric layer; and a third conductive layer within the opening, the third conductive layer making electrical contact to the first conductive layer but being electrically isolated from the second conductive layer by the dielectric sidewall region.

13. The interconnection structure of claim 12 wherein the opening is formed through the first conductive layer to form a sidewall of the first conductive layer.

14. The interconnection structure of claim 12 wherein the opening extends through the first dielectric layer to expose a portion of the substrate.

15. The interconnection structure of claim 14 wherein a diffusion region is formed within the substrate, the diffusion region being electrically coupled to the third conductive layer.

16. The interconnection structure of claim 12 wherein the dielectric sidewall region is a dielectric sidewall spacer formation.

17. The interconnection structure of claim 12 wherein the first conductive layer is made of a material selected from a group consisting of: a metal, a metal alloy, an epitaxial formation, a silicide layer, a salicide layer, and a polysilicon layer.

18. An interconnection structure comprising:

a substrate;

a transistor dielectric layer formed overlying the substrate;

a transistor conductive region formed overlying the transistor dielectric layer, the transistor conductive region functioning as a gate electrode;

an interconnect layer directly overlying a first portion of the transistor conductive region, a silicide region formed adjacent a portion of the interconnect layer;

an opening formed through the interconnect layer and the silicide region to expose a second portion of the transistor conductive region and form a laterally recessed sidewall area of the interconnect layer;

a sidewall dielectric formed adjacent the interconnect layer to isolate the sidewall of the interconnect layer by filling the laterally recessed area of the interconnect layer, the sidewall dielectric lying both above and below laterally recessed area of the interconnect layer; and a conductive layer formed within the opening and connected to the transistor conductive region wherein the contact between the conductive layer and the transistor conductive region is isolated from the interconnect layer by the sidewall dielectric.

* * * * *